US005779792A

United States Patent [19]
Atami et al.

[11] Patent Number: 5,779,792
[45] Date of Patent: Jul. 14, 1998

[54] SINGLE CRYSTAL PULLING APPARATUS

[75] Inventors: Takashi Atami; Hisashi Furuya, both of Tokyo; Michio Kida, Omiya, all of Japan

[73] Assignees: Mitsubishi Materials Silicon Corporation; Mitsubishi Materials Corporation, both of Tokyo, Japan

[21] Appl. No.: 781,843

[22] Filed: Jan. 10, 1997

[30] Foreign Application Priority Data

Jan. 12, 1996 [JP] Japan .................................. 8-004409

[51] Int. Cl.⁶ .................................................. C30B 35/00
[52] U.S. Cl. .......................................... 117/214; 18/213
[58] Field of Search ............................ 117/18, 30, 31, 117/32, 33, 213, 214

[56] References Cited

U.S. PATENT DOCUMENTS

| 5,009,865 | 4/1991 | Boden et al. | 117/202 |
| 5,178,720 | 1/1993 | Frederick | 117/20 |
| 5,196,085 | 3/1993 | Szekely et al. | 117/208 |
| 5,485,802 | 1/1996 | Artekrüger et al. | 117/18 |

FOREIGN PATENT DOCUMENTS 1-28185 11/1969 Japan .
61-222984 10/1986 Japan .

*Primary Examiner*—Felisa Garrett
*Attorney, Agent, or Firm*—Cushman Darby & Cushman IP Group of Pillsbury Madison & Sutro LLP

[57] ABSTRACT

The present invention provides an improved single crystal pulling apparatus for pulling a single crystal semiconductor such as silicon or gallium arsenide. The apparatus of the present invention comprises a gas tight container, a crucible which is disposed inside the container, a heater, and a pair of coils to apply a cusp magnetic field in the semiconductor melt. The crucible is separated into two regions by a cylindrical partition body, and an outside region is used to supply source material and to melt the source material and an inside region is used for pulling up the single crystal. The inside and outside regions are communicated with the communication passage provided at the bottom of the partition body. Electrical currents in opposing directions are applied to a pair of coils for generating in the melt a cusp magnetic field which includes a vertical portion and a horizontal portion relative to the crucible. By positioning the vertical portion of the cusp magnetic field at the position of the communication passage and the horizontal portion below the semiconductor melt, the flow rate of the melt passing through the communication passage is reduced and the convection within the melt is suppressed. Consequently, high quality semiconductor single crystals can be obtained.

6 Claims, 1 Drawing Sheet 5,779,792

1

SINGLE CRYSTAL PULLING APPARATUS

BACKGROUND OF THE INVENTION

1. Field of the invention

The present invention relates to a single crystal pulling apparatus for pulling a single crystal of a semiconductor from a semiconductor melt stored in a double crucible.

2. Description of the Related Art

The CZ growth technique is an example of one of the currently known methods for growing single crystals of semiconductors such as silicon (Si) or gallium arsenide (GaAs). Because this CZ growth technique facilitates growth of large diameter, high purity single crystals which are free from dislocation or have extremely low levels of lattice defects, it is widely used in the growing of a variety of semiconductor crystals.

In recent years, the demands for larger diameter and for higher purity of single crystals, and for uniform distribution of oxygen concentrations and impurity concentrations have increased and various improved methods and apparatuses for CZ growth techniques have been developed to meet these demands. One of the improvements of the aforementioned CZ growth technique which has been proposed is a CZ growth under the application of a magnetic field. This technique offers an excellent method for growing single crystals with good slip-free ratios and with excellent capability for controlling oxygen concentration by applying the magnetic field to the semiconductor melt inside the crucible to suppress convection of the semiconductor melt.

The other example of an improved CZ growth technique includes an apparatus which uses a double crucible by placing a cylindrical partition body inside the crucible, the partition body being provided with a communication passage for communicating the inner region with the outer region of the partition body, and pulling a semiconductor from the inner region of the partition body while supplying the source material continuously to the outer region of the partition body.

In the above improved CZ growth where the semiconductor melt is supplied to the inner region of the partition body through the communication passage provided in the partition body, if the flow rate of the semiconductor melt through the communicating passage is high, there is a danger that a void source (a substance which will generate voids, a type of lattice defect) generated in the outer region for supplying the source material, will diffuse into the melt in the inner region of the double crucible, and thereby inhibit the proper growth of the single crystal of semiconductor.

Accordingly, it is important to suppress the flow rate of the semiconductor melt through the communication passage in order to stabilize the quality of the single crystal semiconductor being produced.

SUMMARY OF THE INVENTION

In view of the above problem, it is an object of the present invention to provide a single crystal pulling apparatus which enables stabilization of the quality of a single crystal semiconductor, by reduction of the flow rate of a semiconductor melt through the communication passage.

The single crystal pulling apparatus of the present invention uses a double crucible which is disposed inside a gas tight container, and the double crucible is formed by mounting a cylindrical partition body inside the crucible to separate the crucible into the outer region and the inner region, and a semiconductor melt is stored in the outer region of the

2 crucible and a single crystal semiconductor is pulled from the melt in the inner region of the crucible. The single crystal pulling apparatus of the present invention is characterized in that the communication passage is formed in the cylindrical partition body for communicating the outer region and the inner region of the crucible, and that a means for application of the cusp magnetic field is provided outside the gas tight container, and the means is disposed such that the substantially horizontal magnetic field is positioned below the surface level of the semiconductor melt, and that the substantially vertical magnetic field is positioned at the communication passage of the partition body.

By employing the means for applying the cusp magnetic field as described above, the substantially vertical magnetic field is applied to cross the flow of the semiconductor melt flowing through the communication passage at approximately a right angle. The crossing of the magnetic field with the flowing melt suppresses the flow rate of the semiconductor melt through the communication passage. Furthermore, the substantially horizontal magnetic field applied below the semiconductor melt surface level suppresses convection within the semiconductor melt. As a consequence, the quality of the single crystal semiconductor can be improved, and in particular, the occurrence of voids in the inside crucible can be suppressed.

DESCRIPTION OF THE PREFERRED EMBODIMENTS

Figure 1:
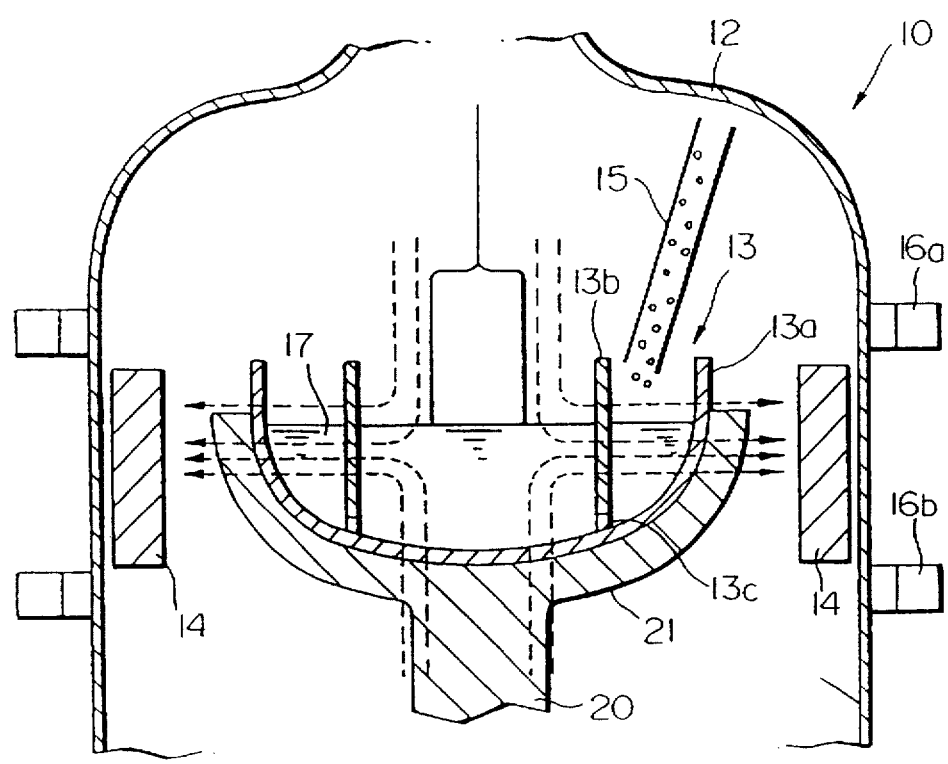
FIG. 1 is a diagram showing a preferred embodiment of a single crystal pulling apparatus of the present invention.

The following is a description of an embodiment of a single crystal pulling apparatus of the present invention with reference to FIG. 1.

A single crystal pulling apparatus 10 comprises a gas tight chamber 12, a crucible 13 located inside the chamber 12, a heater 14 for heating a semiconductor melt 17 inside the crucible 13, and an application means for applying the cusp magnetic field consisting of two coils 16a and 16b disposed at the outside the chamber 12. The crucible 13 comprises an approximately hemispherical outer crucible 13a made of quartz (SiO$_2$), and an inner crucible 13b defined by an cylindrical partition body, made of quartz (SiO$_2$) and disposed inside the outer crucible 13a to define the inside crucible and the outside crucible. The crucible 13 is placed on a susceptor 21, which is mounted on a vertical shaft 20 disposed at the center of the base of the chamber 2.

A communication passage 13c which communicates the outer crucible and the inner crucible of the double crucible is formed at the bottom portion of the inner crucible wall 13b, that is the cylindrical partition body. The communication passage 13c is provided as a notched portion formed by removing a section from the bottom edge of the inner crucible 13b.

In each aforementioned coils 16a and 16b, electric current flows in the opposite direction relative to the other coil; thus, a cusp magnetic field is applied as shown by the dotted lines in FIG. 1. The cusp magnetic field is in the form that the direction thereof gradually changes from vertical to horizontal.

A source material supply tube 15 is provided inside the gas tight chamber 12 to be able to supply the source material into the outside region of the double crucible 13b. The source materials include a flaked polysilicon which has been prepared by crushing a silicon ingot in a crusher, or granular polysilicon prepared by deposition from a gaseous source material using a thermal decomposition. The source materials further include, depending upon necessity, various dopants such as boron (B) and phosphorus (P) for silicon growth, and dopants such as zinc (Zn) and silicon (Si) for growing gallium arsenide.

The cusp magnetic field formed by the coils 16a and 16b is controlled such that the vertical portion of the magnetic field is positioned to coincide with the position of the communication passage 13c of the inner crucible 13b, and the horizontal portion of the magnetic field is located below the surface level of the semiconductor melt. The positioning of the cusp magnetic field is controlled by, for example, adjusting the amount of electric current flowing through the coils 16a and 16b or by moving one of the coils.

In accordance with the above control, the substantially vertical magnetic field applied at the communication passage 13c crosses the flow of the semiconductor melt at an right angle; thus, the magnetic field acts to suppress the flow of the melt through the communication passage. Consequently, the flow of the semiconductor melt through the communication passage 13c is reduced. Furthermore, since the substantially horizontal portion of the cusp magnetic field is located below the surface level of the semiconductor melt, the vertical convection of the semiconductor melt is suppressed. As a result, diffusion of the void source in the semiconductor melt is suppressed, and thereby the quality of the single crystal semiconductor can be improved, and in particular, occurance of voids, or lattice defects in the grown ingot can be suppressed.

Moreover, when it is necessary to move the crucible 13 upward or downward, the position of the cusp magnetic field relative to the semiconductor melt can be controlled by adjusting the current supplied to coils 16a and 16b or by moving both coils identically with the movement of the crucible, in order to position the vertical magnetic field at the position of the communication passage 13c and to apply the horizontal magnetic field below the surface level of the semiconductor melt.

As described above, the single crystal pulling apparatus of the present invention uses a double crucible, which is disposed inside of a gas tight container, and a double crucible is formed by mounting coaxially an inner crucible consisting of a cylindrical partition body inside the crucible, and a single crystal of the semiconductor is pulled from the semiconductor melt from the region inside the inner crucible while the source material is continuously supplied into the outside crucible. Furthermore, a communication passage is formed at the bottom of the partition body for communicating the outer region and the inner region of the double crucible, and a means for applying the cusp magnetic field is provided at the outside of the gas tight container, and the means is positioned such that the substantially horizontal portion of the applied cusp magnetic field positioned below the surface level of the semiconductor melt, and substantially vertical portion of the applied magnetic field is located at the communication passage of the double crucible. Therefore, the flow rate of the semiconductor melt through the communication passage can be reduced and the convection of the semiconductor melt is prevented, which ensures stabilization of the quality of the single crystal semiconductor.

What is claimed is:

1. A single crystal pulling apparatus comprising:

a gas tight container covering a melting region for single crystal material;

a double crucible for storing a semiconductor melt, disposed inside of said gas tight container, having a cylindrical inner crucible defined by a cylindrical partition body mounted inside of an outer crucible, and a communication passage for communicating the outer region and the inner region of the double crucible;

a heater provided inside said gas tight container and outside said double crucible, for heating said double crucible to yield a semiconductor melt; and means for applying the cusp magnetic field provided outside of said gas tight container for applying a cusp magnetic field;

the apparatus characterized in that a substantially horizontal portion of the cusp magnetic field applied by said means is positioned below the surface level of the semiconductor melt, and substantially vertical portion of the cusp magnetic field is located at the position of said communication passage.

2. A single crystal pulling apparatus according to claim 1, the apparatus further comprising:

a source material supply tube for supplying a source material for the semiconductor melt at an outer region of said double crucible;

wherein the outer region of said double crucible storing the semiconductor melt, the single crystal being drawn from the melt in the inner crucible.

3. A single crystal pulling apparatus according to claim 2, wherein the communication passage is a notched portion formed by removing a section from the bottom edge of the partition body defining the inner crucible.

4. A single crystal pulling apparatus according to claim 1, wherein said means for applying the cusp magnetic field including tipper and lower coils, said coils being positioned such that a cusp magnetic field consisting of a vertical portion and a horizontal portion is formed in the semiconductor melt by passing electric current in opposite directions through said two coils.

5. A single crystal pulling apparatus according to claim 4, wherein said two coils are positioned such that said vertical portion of the cusp magnetic field coincides with the position of the communicating passage at the bottom of said inner crucible, and said horizontal portion of the cusp magnetic field is positioned below the surface level of said semiconductor melt.

6. A single crystal pulling apparatus according to claim 5, wherein said two coils are moved up and down in accordance with the up and down movement of said crucible, such that the position of said vertical portion of the cusp magnetic field is maintained at the position of said connecting portion, and the location of said horizontal portion of the cusp magnetic field remains below the surface of said semiconductor melt.

* * * * *